(12) United States Patent
Sills

(10) Patent No.: US 9,070,874 B2
(45) Date of Patent: *Jun. 30, 2015

(54) MEMORY CELL STRUCTURES

(71) Applicant: Micron Technology, Inc., Boise, ID (US)

(72) Inventor: Scott E. Sills, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/085,192

(22) Filed: Nov. 20, 2013

(65) Prior Publication Data

US 2014/0138608 A1 May 22, 2014

Related U.S. Application Data

(63) Continuation of application No. 13/175,482, filed on Jul. 1, 2011, now Pat. No. 8,598,562.

(51) Int. Cl.
*H01L 45/00* (2006.01)
*H01L 27/24* (2006.01)

(52) U.S. Cl.
CPC .......... *H01L 45/1253* (2013.01); *H01L 45/04* (2013.01); *H01L 45/085* (2013.01); *H01L 45/1233* (2013.01); *H01L 45/1266* (2013.01); *H01L 45/1273* (2013.01); *H01L 45/141* (2013.01); *H01L 45/146* (2013.01); *H01L 45/147* (2013.01); *H01L 27/2472* (2013.01)

(58) Field of Classification Search
None
See application file for complete search history.

(56) References Cited

U.S. PATENT DOCUMENTS

| 5,107,459 | A | 4/1992 | Chu et al. |
| 6,670,628 | B2 | 12/2003 | Lee et al. |
| 7,259,076 | B2 | 8/2007 | Hsu |
| 7,791,925 | B2 | 9/2010 | Li et al. |
| 7,817,464 | B2 | 10/2010 | Kuh et al. |
| 7,910,911 | B2 | 3/2011 | Breitwisch et al. |

(Continued)

FOREIGN PATENT DOCUMENTS

| JP | 2006032729 A | 2/2006 |
| JP | 2008091601 A | 4/2008 |

(Continued)

OTHER PUBLICATIONS

Sung Hyun Jo; Kuk-Hwan Kim; Ting Chang; Gaba, S.; Wei Lu;, "Si Memristive devices applied to memory and neuromorphic circuits," Circuits and Systems (ISCAS), Proceedings of 2010 IEEE International Symposium on , vol., No., pp. 13-16, May 30, 2010-Jun. 2, 2010.

(Continued)

*Primary Examiner* — Joseph Schoenholtz
(74) *Attorney, Agent, or Firm* — Brooks, Cameron & Huebsch, PLLC

(57) ABSTRACT

The present disclosure includes memory cell structures and method of forming the same. One such memory cell includes a first electrode having sidewalls angled less than 90 degrees in relation to a bottom surface of the first electrode, a second electrode, including an electrode contact portion of the second electrode, having sidewalls angled less than 90 degrees in relation to the bottom surface of the first electrode, wherein the second electrode is over the first electrode, and a storage element between the first electrode and the electrode contact portion of the second electrode.

20 Claims, 3 Drawing Sheets

(56) References Cited

U.S. PATENT DOCUMENTS

| | | | |
|---|---|---|---|
| 8,097,870 | B2 | 1/2012 | Hutchinson et al. |
| 8,129,250 | B2 | 3/2012 | Rossel et al. |
| 8,598,562 | B2 * | 12/2013 | Sills .................................. 257/4 |
| 2003/0071255 | A1 | 4/2003 | Xu |
| 2003/0127669 | A1 | 7/2003 | Doan et al. |
| 2003/0189200 | A1 * | 10/2003 | Lee et al. ........................ 257/1 |
| 2004/0175857 | A1 | 9/2004 | Lowrey et al. |
| 2004/0197947 | A1 | 10/2004 | Fricke et al. |
| 2005/0012119 | A1 | 1/2005 | Herner et al. |
| 2006/0006471 | A1 | 1/2006 | Rossel et al. |
| 2007/0096162 | A1 | 5/2007 | Happ et al. |
| 2008/0121862 | A1 | 5/2008 | Liu |
| 2008/0283815 | A1 | 11/2008 | Nejad |
| 2009/0298253 | A1 * | 12/2009 | Rossel et al. .................. 438/382 |
| 2010/0038617 | A1 | 2/2010 | Nakajima et al. |
| 2010/0109085 | A1 | 5/2010 | Kim et al. |
| 2010/0110746 | A1 | 5/2010 | Hutchinson et al. |
| 2010/0155687 | A1 | 6/2010 | Reyes et al. |
| 2011/0024710 | A1 | 2/2011 | Bratkovski et al. |
| 2011/0084248 | A1 | 4/2011 | Hsieh et al. |
| 2011/0175053 | A1 | 7/2011 | Fukumizu |

FOREIGN PATENT DOCUMENTS

| | | |
|---|---|---|
| JP | 2009246309 A | 10/2009 |
| JP | 2010067942 A | 3/2010 |
| KR | 10-2010-0074545 A | 7/2010 |
| WO | 2010-082922 A1 | 7/2010 |

OTHER PUBLICATIONS

Tetzlaff, Ronald; Schmidt, Torsten;, "Memristors and memristive circuits—an overview," Circuits and Systems (ISCAS), 2012, IEEE International Symposium on pp. 1590-1595, May 20-23, 2012.

Brewer, J.E.; Zhirnov, V.V.; Hutchby, J.A.;, "Memory technology for post CMOS era," Circuits and Devices Magazine, IEEE, vol. 21, No. 2, pp. 13-20, Mar.-Apr. 2005.

Burr, G. W.; Kurdi, B. N.; Scott, J. C.; Lam, C. H.; Gopalakrishnan, K.; Shenoy, R. S. "Overview of candidate device technologies for storage-class memory," IBM Journal of Research and Development, vol. 52, No. 4.5, pp. 449-464, Jul. 2008.

Kuk-Hwan Kim, Siddharth Gaba, Dana Wheeler, Jose M. Cruz-Albrecht, Tahir Hussain, Narayan Srinivasa, and Wei Lu, "A Functional Hybrid Memristor Crossbar-Array/CMOS System for Data Storage and Neuromorphic Applications", Nano Letters, 2012 12 (1), 389-395.

Ou, Elaine, and S. Simon Wong. "Array Architecture for a Nonvolatile 3-Dimensional Cross-Point Resistance-Change Memory." IEEE Journal of Solid-State Circuits 46.9 (2011): 2158-170.

Park, Sung-Ki. "The Future Memory Technologies." Proc. of SEMATECH Symposium Korea, Seoul. Austin: SEMATECH, Oct. 27-28, 2011.

Yu, Lee-Eun, Sungho Kim, Min-Ki Ryu, Sung-Yool Choi, and Yang-Kyu Choi. "Structure Effects on Resistive Switching of Al/TiOx/Al Devices for RRAM Applications." IEEE Electron Device Letters 29.4 (2008): 331-33.

International Search Report and Written Opinion for related PCT Application No. PCT/US2012/044581, mailed Feb. 1, 2013. (9 pgs).

Office Action from related Taiwanese patent application No. 101123633, dated Dec. 1, 2014, 14 pp.

Office Action from related Korean patent application No. 10-2014-7001905, dated Dec. 31, 2014, 13 pp.

Notice of Rejection Ground from related Japanese patent application No. 2014-519002, dated Jan. 27, 2015, 9 pp.

Search Report from related European patent application No. 12807889.6, dated Feb. 20, 2015, 6 pp.

* cited by examiner

MEMORY CELL STRUCTURES

PRIORITY INFORMATION

This application is a Continuation of U.S. application Ser. No. 13/175,482, filed Jul. 1, 2011, the specification of which is incorporated herein by reference.

TECHNICAL FIELD

The present disclosure relates generally to semiconductor memory devices and methods, and more particularly, memory cell structures and methods for forming the same.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), flash memory, phase change random access memory (PCRAM), spin torque transfer random access memory (STTRAM), resistive random access memory (RRAM), magnetoresistive random access memory (MRAM; also referred to as magnetic random access memory), conductive-bridging random access memory (CBRAM), among others.

Memory devices are utilized as non-volatile memory for a wide range of electronic applications in need of high memory densities, high reliability, and low power consumption. Non-volatile memory may be used in a personal computer, a portable memory stick, a solid state drive (SSD), a personal digital assistant (PDA), a digital camera, a cellular telephone, a portable music player, e.g., MP3 player, a movie player, and other electronic devices, among others. Program code and system data, such as a basic input/output system (BIOS), are typically stored in non-volatile memory devices.

Many memory devices, such as RRAM, PCRAM, MRAM, STTRAM and CBRAM, for example, can include arrays of memory cells organized in a two-terminal cross-point architecture, for instance. Arrays of memory cells in a two-terminal cross-point architecture can include electrodes that have planar surfaces between the memory cell material. For filamentary-type memory device, e.g., RRAM and/or CBRAM, the location of the active region of the memory cell between planar surfaces of the electrodes can be variable because the planar surfaces of the electrodes provide a substantially uniform electric field across the memory cell material.

DETAILED DESCRIPTION

Figure 1:
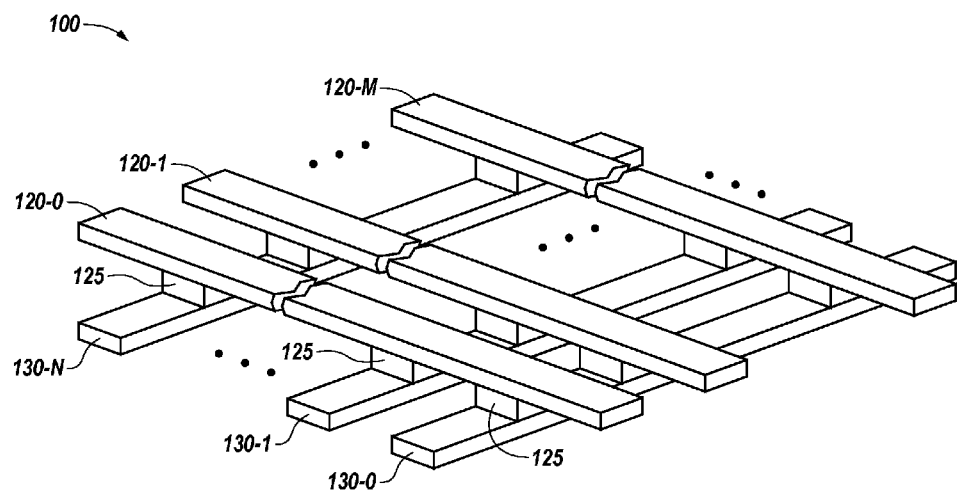
FIG. 1 is a block diagram illustrating a portion of an array of memory cells.

The present disclosure includes memory cell structures and method of forming the same. One such memory cell includes a first electrode having sidewalls angled less than 90 degrees in relation to a bottom surface of the first electrode, a second electrode, including an electrode contact portion of the second electrode, having sidewalls angled less than 90 degrees in relation to the bottom surface of the first electrode, wherein the second electrode is over the first electrode, and a storage element between the first electrode and the electrode contact portion of the second electrode.

In one or more embodiments, a memory cell with a first electrode having sidewalls angled less than 90 degrees in relation to a bottom surface of the first electrode and an electrode contact portion of a second electrode having sidewalls angled less than 90 degrees in relation to the bottom surface of the first electrode can have its location of filament nucleation localized between a blunted peak of the first electrode and a point of the electrode contact portion of the second electrode.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more such things. For example, a number of memory devices can refer to one or more memory devices. Additionally, the designators "N" and "M" as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 208 may reference element "08" in FIG. 2, and a similar element may be referenced as 308 in FIG. 3. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure, and should not be taken in a limiting sense.

FIG. 1 is a block diagram illustrating a portion of an array 100 of memory cells. In the example illustrated in FIG. 1, the array 100 is a cross-point array including a first number of conductive lines 130-0, 130-1, . . . , 130-N, e.g., access lines, which may be referred to herein as word lines, and a second number of conductive lines 120-0, 120-1, . . . , 120-M, e.g., data lines, which may be referred to herein as bit lines. As illustrated, the word lines 130-0, 130-1, . . . , 130-N are substantially parallel to each other and are substantially orthogonal to the bit lines 120-0, 120-1, . . . , 120-M, which are substantially parallel to each other; however, embodiments are not so limited.

The memory cells of array 100 can be memory cells such as those described in connection with FIGS. 2, 3, 4A, 4B, and 4C. In this example, a memory cell is located at each of the intersections of the word lines 130-0, 130-1, . . . , 130-N and bit lines 120-0, 120-1, . . . , 120-M and the memory cells can function in a two-terminal architecture, e.g., with a particular word line 130-0, 130-1, . . . , 130-N and bit line 120-0, 120-1, . . . , 120-M as the electrodes for the memory cells.

The memory cells can be, for example, resistance variable memory cells, e.g., RRAM cells, CBRAM cells, PCRAM cells, and/or STT-RAM cells, among other types of memory cells. A storage element 125 can include a storage element material and/or a select device, e.g., an access device. The storage element material portion of storage element 125 can include a programmable portion of the memory cell, e.g., the portion programmable to a number of different data states. The access device can be a diode or a non-ohmic device (NOD), among others. For instance, in resistance variable memory cells, a storage element can include the portion of the memory cell having a resistance that is programmable to particular levels corresponding to particular data states responsive to applied programming voltage and/or current pulses, for instance. A storage element can include one or more materials, which collectively comprise a variable resistance storage element material portion of a storage element. For instance, the materials may include at least one of a metal ion source layer, an oxygen gettering, e.g., source, layer, and an active switching layer, such as a solid state electrolyte, a chalcogenide, a transition metal oxide material, or a mixed valence oxide with two or more metals, e.g., transition metals, alkaline earth metals, and/or rare earth metals. Embodiments are not limited to a particular resistance variable material or materials associated with the storage elements 125 of the memory cells. For instance, the resistance variable material can be a chalcogenide formed of various doped or undoped materials. Other examples of resistance variable materials that can be used to form storage elements include binary metal oxide materials, colossal magnetoresistive materials, and/or various polymer based resistance variable materials, among others.

In operation, the memory cells of array 100 can be programmed by applying a voltage, e.g., a write voltage, across the memory cells via selected word lines 130-0, 130-1, . . . , 130-N and bit lines 120-0, 120-1, . . . , 120-M. The width and/or magnitude of the voltage pulses across the memory cells can be adjusted, e.g., varied, in order to program the memory cells to particular data states, e.g., by adjusting a resistance level of the storage element.

A sensing, e.g., read, operation can be used to determine the data state of a memory cell by sensing current, for example, on a bit line 120-0, 120-1, . . . , 120-M corresponding to the respective memory cell responsive to a particular voltage applied to the selected word line 130-0, 130-1, . . . , 130-N to which the respective cell is coupled. Sensing operations can also include biasing unselected word lines and bit lines at particular voltages in order to sense the data state of a selected cell.

Figure 2:
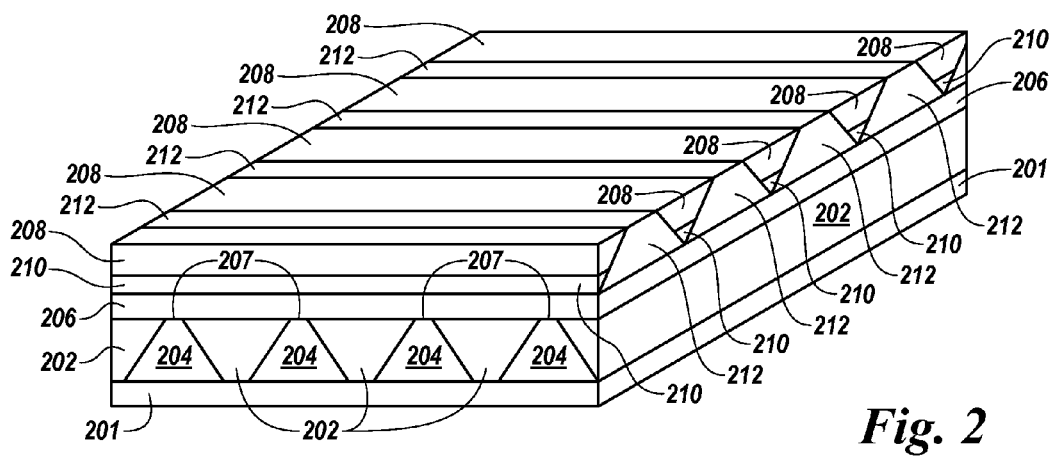
FIG. 2 illustrates a portion of an array of memory cells in accordance with one or more embodiments of the present disclosure.

FIG. 2 illustrates a portion of an array of memory cells in accordance with one or more embodiments of the present disclosure. The array of memory cells in FIG. 2 can be an array such as array 100 illustrated in FIG. 1. As illustrated in FIG. 2, an electrode material 204 is formed one a substrate material 201. The substrate material 201 can be a semiconductor material, for example silicon, among various other substrate materials. The electrode material 204 can be a conductive material, such as copper and/or tungsten, among various other conductive materials. The electrode material 204 can be a bottom electrode, e.g., a conductive line, for example, an access line such as word lines 130-0 to 130-N or a data line such as bit lines 120-0 to 120-M shown in FIG. 1. The electrode material 204 can be etched to form a number of valleys therein. The valleys in the electrode material 204 can be formed using an isotropic etching process, such as plasma etching and/or a wet etch process, for example. The valleys in the electrode material 204 have non-vertical sidewalls, e.g., at an angle less than 90° in relation to the planar bottom surface of the electrode material 204. In one or more embodiments, the sidewalls can have an angle of between at least 10 degrees and 80 degrees. In one or more embodiments, the sidewalls can have an angle between about 30 degrees and about 60 degrees. In one or more embodiments, the sidewalls can be convex and/or concave while being substantially non-vertical. Embodiments are not limited to a particular non-vertical angle for the sidewalls of electrode 204. The etching of the electrode material 204 to form the valleys therein can also isolate the electrodes 204 from each other.

In one or more embodiments, the valleys in the contact material 204 can be filled with a dielectric material 202. The dielectric material 202 can be a dielectric oxide or nitride, such as silicon nitride ($Si_3N_4$) or silicon oxide (SiOx), among various other dielectric materials. In the example shown in FIG. 2, the dielectric material 202 and the electrode material 204 are planarized forming a planar surface of the dielectric material 202 and the electrode material 204. Planarizing the surface of the electrode material 204 can result in the cross-sections of the electrodes 204 having a trapezoidal cross-sectional shape and electrode 204 is separated by the dielectric material 202 formed in the respective valley therebetween. Although not illustrated in FIG. 2, the electrodes 204 form conductive lines, e.g., in a direction into the page.

In one or more embodiments, a storage element material 206 can be formed over the planarized surface of the dielectric material 202 and the electrode material 204. The electrode material 204 includes a contact portion 207. The contact portion of the electrode material 207 can interface and contact the storage element material 206. The storage element material 206 can be formed using a deposition process, such as atomic layer deposition (ALD) and/or chemical vapor deposition (CVD), for example. The storage element material 206 can include, for instance, one or more resistance variable materials such as a transition metal oxide material or a perovskite including two or more metals, e.g., transition metals, alkaline earth metals, and/or rare earth metals. Embodiments are not limited to a particular resistance variable material.

A dielectric material 212 can be formed over the storage element material 206. The dielectric material 212 can be a dielectric oxide or nitride, such as silicon nitride ($Si_3N_4$) or silicon oxide (SiOx), for example. The material 212 can be etched to form valleys therein. The valleys in the material 212 can be formed using an isotropic etching process, such as plasma etching and/or a wet etch process, for example. The etching process can be a selective etch process that etches down to the storage element material 206. The sidewalls of the valleys in the dielectric material 212 are non-vertical, e.g., at an angle less than 90° in relation to the bottom planar surface of the substrate and/or the bottom surface of the electrode material 204, and can be straight, convex, and/or concave.

As illustrated in FIG. 2, an electrode contact portion 210 of electrode 208 can be formed in the valleys formed in the dielectric material 212. As such, the electrode contact portion 210 of electrode 208 has sidewalls defined by the sidewalls of the valleys formed in the dielectric material 212. The electrode contact portion 210 of electrode 208 can be formed via a deposition process such as physical vapor deposition (PVD), CVD, and/or ALD. Embodiments are not limited to a particular contact material. In one or more embodiments, the contact material 210 can be comprised of the same material as the electrode material 208. In one or more embodiments, the contact material 210 can be comprised of a material different than that of electrode material 208. For example, the contact material 210 can be a metal ion source material, such as silver sulfide and/or copper telluride, while the electrode material 208 can be tungsten and/or copper. In one or more embodiments where the contact material 210 and electrode material 208 are different materials, at least one interpositional layer, e.g. TaN, may be included between 210 & 208 (not illustrated), to provide adhesion and/or a diffusion barrier.

An electrode material 208 can be formed in the remaining portion of the valleys formed in the dielectric material 212, e.g., the portions left unfilled by electrode contact portion 210 of electrode 208, to contact the electrode contact portion 210. The electrode material 208 can be a conductive material, such as copper and/or tungsten, for example. The electrode material 208 can be a top electrode, e.g., a conductive line, for example, an access line such as word lines 130-0 to 130-N or a data line such as bit lines 120-0 to 120-M shown in FIG. 1. The electrode material 208 formed in the valleys and the dielectric material 212 can be planarized, e.g., etched back, to isolate the electrode material 208 in each respective valley formed in the dielectric material 212. The valleys formed in the dielectric material 212 have an orientation non-parallel to the valleys formed in the electrode material 204, e.g. such that electrodes 204 and 208 are non-parallel. In one or more embodiments, electrodes 204 and 208 are orthogonal.

Memory cells in accordance with the embodiment illustrated in FIG. 2 can provide reduced variability with regard to a location of filament nucleation, as compared to previous memory cells, e.g., CBRAM and/or RRAM cells. For instance, the location of filament nucleation can be localized between the blunted peak of a respective electrode 204 and the point of respective electrode contact portion 210. That is, the location of the filament nucleation is between the point of the electrode contact portion 210 of electrode 208 and the blunted peak of electrode material 204, which is less variable than a memory cell that has a location of filament nucleation anywhere between two planar surfaces, for instance. Also, the point of the electrode contact portion 210 of electrode 208 and the blunted peak of electrode material 204 can concentrate the electric-field in the storage element material 206 such that a forming voltage associated with a memory cell in FIG. 2 is less than a forming voltage for a memory cell having electrodes with planar surfaces.

Figure 3:
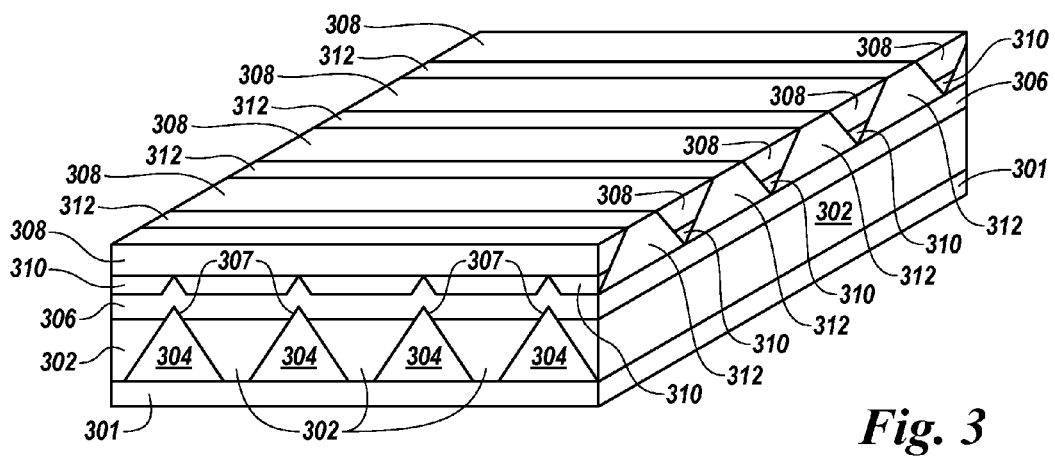
FIG. 3 illustrates of a portion of an array of memory cells in accordance with one or more embodiments of the present disclosure.

FIG. 3 illustrates a portion of an array of memory cells in accordance with one or more embodiments of the present disclosure. The array of memory cells in FIG. 3 can be an array such as array 100 illustrated in FIG. 1. As illustrated in FIG. 3, an electrode material 304 can be formed on a substrate 301. The substrate material 301 can be a substrate material such as silicon, among various other substrate materials. The electrode material 304 can be a conductive material, such as copper and/or tungsten, among various other conductive materials. The electrode material 304 can be a bottom electrode, e.g., a conductive line, for example, an access line such as word lines 130-0 to 130-N or a data line such as bit lines 120-0 to 120-M shown in FIG. 1. The electrode material 304 can be etched to form a number of valleys therein. The valleys in the electrode material 304 can be formed using a generally isotropic etching process, such as plasma etching and/or a wet etch process, for example. The valleys in the electrode material 304 have non-vertical sidewalls, e.g., at an angle less than 90° in relation to the planar bottom surface of the electrode material 304. In one or more embodiments, the sidewalls can have an angle of between at least 10 degrees and 80 degrees. In one or more embodiments, the sidewalls can have an angle between about 30 degrees and about 60 degrees. Embodiments are not limited to a particular non-vertical angle for the sidewalls of electrode 304. The etching of the electrode material 304 to form the valleys therein can also isolate the electrodes 304 from each other.

In one or more embodiments, the valleys in the electrode material 304 can be filled with a dielectric material 302. The dielectric material 302 can be a dielectric oxide or nitride, such as silicon nitride ($Si_3N_4$) or silicon oxide (SiOx), among various other dielectric materials. In the example shown in FIG. 3, the dielectric material 302 can be etched to expose the peaks of the electrode material 304. The dielectric material 302 can be etched using an anisotropic etching process, such as plasma etching and/or physical sputtering, for example. The etching process can be a selective etch process that etches only the dielectric material 302. Etching the electrode material 304 can result in cross-sections of the electrodes 304 having of triangle cross-sectional shape. Etching the electrode material 304 can include forming triangle shaped cross-sections in the electrode material 304, wherein each substantially triangle shaped portion of the electrode material is separated by dielectric material 302 formed in the respective valley therebetween. Although not illustrated in FIG. 3, the electrodes 304 form conductive lines, e.g., in direction into the page.

In one or more embodiments, a storage element material 306 can be formed over the electrode material 304 and the dielectric material 302. The storage element material 306 can be formed using a deposition process, such as atomic layer deposition (ALD) and/or chemical vapor deposition (CVD), for example. The electrode material 304 includes a contact portion 307. The contact portion of the electrode material 307 can interface the storage element material 306. The storage element material 306 is formed on the peaks of the electrode material 304 and the conformal process used to form the storage element material 306 can cause the storage element material 306 to include peaks that are formed over the peaks of the electrode material 304. The storage element material 306 can include, for instance, one or more resistance variable materials such as a solid state electrolyte comprised of a transition metal oxide material or a chalcogenide material. Embodiments are not limited to a particular resistance variable material.

A dielectric material 312 can be formed over the storage element material 306. The dielectric material 312 can be a dielectric oxide or nitride, such as silicon nitride ($Si_3N_4$) or silicon oxide (SiOx), for example. The dielectric material 312 can be etched to form valleys therein. The valleys in the dielectric material 312 can be formed using an isotropic etching process, such as plasma etching and/or a wet etch process, for example. The etching process can be a selective etch process that etches down to the storage element material 306. The sidewalls of the valleys in the dielectric material 312 are non-vertical, e.g., at an angle less than 90° in relation to the bottom planar surface of the dielectric material 312 and/or the bottom surface of the electrode material 304.

As illustrated in FIG. 3, an electrode contact portion 310 of an electrode 308 can be formed in the valleys formed in the dielectric material 312. As such, the electrode contact portion 310 of electrode 308 can be formed on the peaks of the storage element material 306. The peaks of the storage element material 306 can act as saddles, wherein the electrode contact portion 310 of electrode 308 is totaled on the peaks. The electrode contact portion 310 of electrode 308 can have sidewalls defined by the sidewalls of the valleys formed in the dielectric material 312. The electrode contact material can be totaling using PVD, CVD, and/or ALD. In various embodiments, the electrode contact portion 310 of electrode 308 can be CuTe formed via PVD. However, embodiments are not limited to a particular contact material.

An electrode material 308 can be formed in the remaining portion of the valleys formed in the dielectric material 312, e.g., the portion left unfilled by an electrode contact portion 310 of electrode 308, to contact the electrode contact portion 310. The electrode material 308 can be a conductive material, such as copper and/or tungsten, for example. The electrode material 308 can be a top electrode, e.g., a conductive line, for example, an access line such as word lines 130-0 to 130-N or a data line such as bit lines 120-0 to 120-M shown in FIG. 1. The electrode material 308 formed in the valley and the dielectric material 312 can be planarized, e.g., polished and/or etched back, to isolate the electrode material 308 in each respective valley formed in the dielectric material 312. The valleys formed in the dielectric material 312 can have an orientation orthogonal to the valleys formed in the electrode material 304, e.g. such that electrodes 304 and 308 are orthogonal.

Memory cells in accordance with the embodiment illustrated in FIG. 3 can provide reduced variability with regard to a location of filament nucleation, as compared to previous memory cells, e.g., CBRAM and/or RRAM cells. For instance, the location of filament nucleation can be localized between the electrode contact portion 310 of electrode 308 formed on the peak of storage element material 306 and the peak of electrode material 304. That is, the location of the filament nucleation is between the electrode contact portion 310 of electrode 308 coupled to the peak of storage element material 306 and the peak of electrode material 304, which is less variable than a memory cell that has a location of filament nucleation between two planar surfaces, for instance. Also, the electrode contact portion 310 of electrode 308 coupled to the peak of storage element material 306 and the peak of electrode material 304 can concentrate the electric-field in the storage element material 306 such that a forming voltage for a memory cell in FIG. 3 is less than a forming voltage associated with a memory cell having electrodes with planar surfaces.

Figure 4A:
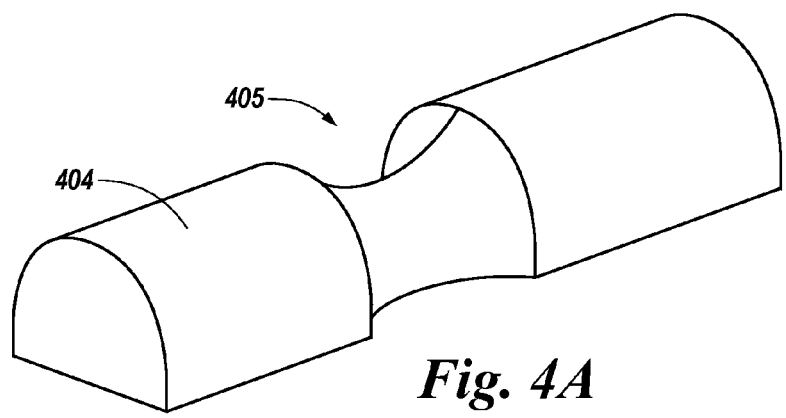
FIGS. 4A-4C illustrate a portion of a memory cell in accordance with one or more embodiments of the present disclosure.
Figure 4B:
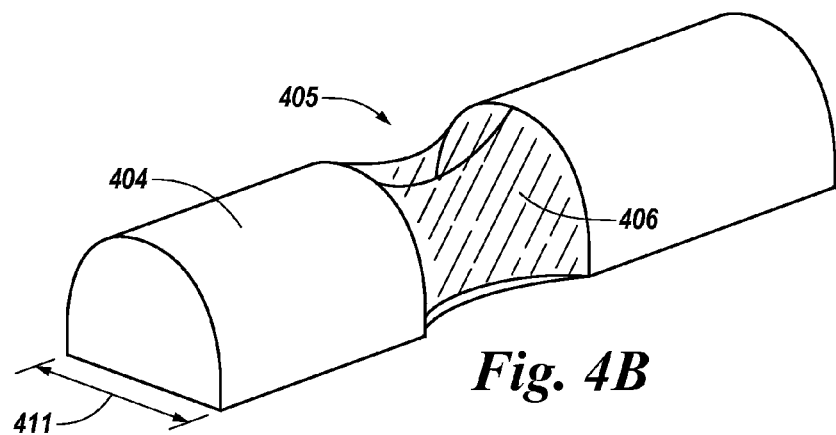
Figure 4C:
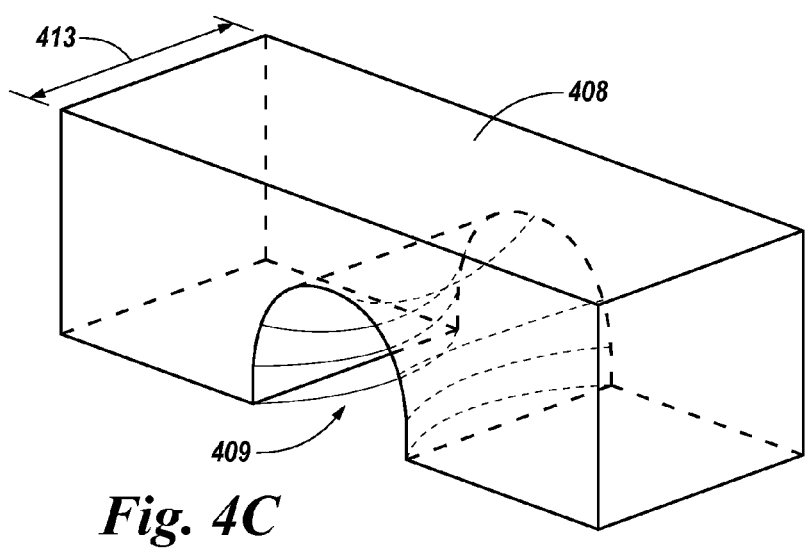

FIGS. 4A-4C illustrate a portion of a memory cell in accordance with one or more embodiments of the present disclosure. FIG. 4A is a block diagram of a portion of a memory cell in accordance with one or more embodiments of the present disclosure. FIG. 4A illustrates an electrode 404 of a memory cell. The electrode 404 can be a bottom electrode of the memory cell. In a number of embodiments, the electrode 404 includes a saddle region 405. The saddle region 405 includes an area that is recessed from the surfaces of the electrode 404, e.g., such that it has a saddle shape. The saddle region 405 can be formed by etching the electrode 404. The etching of electrode 404 to form saddle region 405 can be done using plasma and/or wet chemical etching processes, for example. The saddle region 405 can include a surface area that is greater than the pre-etched surface area of the portion of the electrode 404 that is etched.

FIG. 4B is a block diagram of a portion of a memory cell in accordance with one or more embodiments of the present disclosure. FIG. 4B illustrates the electrode 404 of FIG. 4A with storage element material 406 formed in the saddle region 405. The storage element material 406 is of uniform thickness, and makes conformal contact with the electrode 404 over the surface area of the saddle region 405 that was defined during the etch process described above in association with FIG. 4A. The surface area of the portion of the saddle region 405 in contact with the storage element material 406 is greater than a surface area of a surface of the bottom of electrode 404 beneath the saddle region, which is the area of a corresponding planar cross-point device. The interfacial area of the portion of the saddle region 405 in contact with the storage element material 406 is greater than the projected areal footprint of storage element. The projected areal footprint of the storage element can be defined by multiplying the width 411 of electrode 404 and the width 413 of electrode 408.

FIG. 4C is a block diagram of a portion of a memory cell in accordance with one or more embodiments of the present disclosure. In FIG. 4C, an electrode 408 is illustrated. Electrode 408 can be a top electrode and can be formed over the material 406 formed in saddle region 405 of electrode 404 shown in FIG. 4B. As such, electrode 408 is formed conformally over saddle region 405 and conformal storage element material 406 via subtractive and/or damascene processing. As such, electrode 408 includes an inverted saddle region 409. The surface area of 409 can be in contact with the outer surface area of the storage element material 406 when electrode 408 is placed on electrode 404. The electrode 408 can be configured so that a bottom surface of electrode 408 is below a top surface of electrode 404 when electrode 408 is placed on electrode 404. The surface area of storage element material 406 is greater than a surface area of a surface of the bottom of the electrode 404 beneath the saddle region, which corresponds with the area of a planar device. Electrode 408 can be placed on electrode 404 and storage element material 406 so that electrode 408 is oriented non-parallel to electrode 404.

Memory cells formed in accordance with the embodiment illustrated in FIGS. 4A-4C have a greater surface area of contact between electrodes and storage element material, e.g., between electrodes 406 and 408 and storage element material 406, as compared to memory cells having a planar surface area for the contact between electrodes and storage element material. The greater surface area of contact between electrodes and storage element material in memory cells provided by saddle cross-point, as compared to planar cross-point, memory cells can offer greater signal-to-noise ratio, e.g., sense margin, for a given technology node and for RRAM devices with an area-distributed switching mechanism, among other benefits.

CONCLUSION

The present disclosure includes memory cell structures and method of forming the same. One such memory cell includes a first electrode having sidewalls angled less than 90 degrees in relation to a bottom surface of the first electrode, a second electrode, including an electrode contact portion of the second electrode, having sidewalls angled less than 90 degrees in relation to the bottom surface of the first electrode, wherein the second electrode is over the first electrode, and a storage element between the first electrode and the electrode contact portion of the second electrode.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory cell, comprising:
a resistance variable material formed on a first electrode, wherein the first electrode has non-vertical sidewalls;
a first dielectric material formed on a top surface of the resistance variable material and having a valley formed therein; and
a contact portion of a second electrode formed in the valley such that the contact portion has non-vertical sidewalls defined by the valley.

2. The memory cell of claim 1, wherein a remaining portion of the second electrode is formed over the contact portion of the second electrode within the valley such that the remaining portion of the second electrode has non-vertical sidewalls defined by the valley.

3. The memory cell of claim 1, wherein the first electrode is a bottom electrode and a second dielectric material with non-vertical sidewalls is formed in a valley between the bottom electrode and an adjacent bottom electrode.

4. The memory cell of claim 1, wherein the first electrode is a bottom electrode conductor line.

5. The memory cell of claim 1, wherein the resistance variable material is formed on a peak of the first electrode.

6. The memory cell of claim 1, wherein the resistance variable material is formed on a blunted peak of the first electrode.

7. The memory cell of claim 1, wherein a contact portion of the first electrode with the resistance variable material is defined by the non-vertical sidewalls of the first electrode.

8. A memory cell, comprising:
a first electrode having sidewalls angled less than 90 degrees in relation to a bottom surface of the first electrode;
a second electrode having sidewalls angled less than 90 degrees in relation to the bottom surface of the first electrode, wherein the second electrode is formed on an angled sidewall of a first dielectric material; and
a storage element between the first electrode and an electrode contact portion of the second electrode, wherein the first dielectric material is formed on a top surface of the storage element.

9. The memory cell of claim 8, wherein the electrode contact portion of the second electrode has sidewalls angled less than 90 degrees in relation to the bottom surface of the first electrode.

10. The memory cell of claim 8, wherein the first electrode has a trapezoidal cross-sectional area and sidewalls that are selected from the group consisting of straight, concave, and convex.

11. The memory cell of claim 10, wherein a top surface of the trapezoidal cross-sectional area of the first electrode is an electrode contact portion of the first electrode and is in contact with the storage element.

12. The memory cell of claim 8, wherein the first electrode has a triangular cross-sectional area and sidewalls that are selected from the group consisting of straight, concave, and convex sidewalls.

13. The memory cell of claim 8, wherein the storage element includes a resistance variable material and a select device.

14. The memory cell of claim 8, wherein the sidewalls of the electrode contact portion converge toward the storage element.

15. The memory cell of claim 14, wherein an active region of the memory cell is between an apex of the first electrode and an apex of the electrode contact portion of the second electrode.

16. A memory cell, comprising:
a resistance variable material formed on a peak of a first electrode having angled sidewalls such that the resistance variable material includes a peak and angled sidewalls;
a first dielectric material formed on the resistance variable material and having a valley formed therein, wherein the valley includes angled sidewalls converging towards the peak; and
a second electrode formed in the valley such that the second electrode has angled sidewalls defined by the valley.

17. The memory cell of claim 16, wherein the second electrode includes a contact portion that is formed in the valley.

18. The memory cell of claim 17, wherein the contact portion of the second electrode is formed on the peak of the resistance variable material and overlaps the sidewalls of the resistance variable material.

19. The memory cell of claim 17, wherein a surface area of contact between the contact portion of the second electrode and the resistance variable material is defined by the sidewalls of the resistance variable material.

20. The memory cell of claim 17, wherein the angled sidewalls of the contact portion of the second electrode are angled about 10 degrees to about 80 degrees in relation to a bottom surface of the first dielectric material.

* * * * *